United States Patent
Franceschini et al.

(10) Patent No.: US 9,196,829 B2
(45) Date of Patent: Nov. 24, 2015

(54) POST-FABRICATION SELF-ALIGNED INITIALIZATION OF INTEGRATED DEVICES

(71) Applicant: International Business Machines Corporation, Armonk, NY (US)

(72) Inventors: Michele M. Franceschini, White Plains, NY (US); John P. Karidis, Ossining, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 195 days.

(21) Appl. No.: 13/833,139

(22) Filed: Mar. 15, 2013

(65) Prior Publication Data

US 2013/0200321 A1    Aug. 8, 2013

Related U.S. Application Data

(62) Division of application No. 12/873,058, filed on Aug. 31, 2010, now Pat. No. 8,575,008.

(51) Int. Cl.
*H01L 21/00* (2006.01)
*H01L 45/00* (2006.01)

(52) U.S. Cl.
CPC .............. *H01L 45/126* (2013.01); *H01L 45/04* (2013.01); *H01L 45/1226* (2013.01); *H01L 45/144* (2013.01)

(58) Field of Classification Search
CPC .... H01L 45/04; H01L 45/1226; H01L 45/144
See application file for complete search history.

(56) References Cited

U.S. PATENT DOCUMENTS

| | | | |
|---|---|---|---|
| 3,207,061 A | 9/1965 | Zaromb et al. | |
| 3,494,803 A | 2/1970 | Avis et al. | |
| 5,825,046 A * | 10/1998 | Czubatyj et al. | 257/2 |
| 6,087,674 A | 7/2000 | Ovshinsky et al. | |
| 6,507,061 B1 | 1/2003 | Hudgens et al. | |
| 7,031,181 B1 | 4/2006 | Happ | |
| 7,107,276 B2 | 9/2006 | Johnson, Jr. | |
| 7,186,998 B2 | 3/2007 | Ovshinsky et al. | |
| 7,254,059 B2 | 8/2007 | Li et al. | |

(Continued)

FOREIGN PATENT DOCUMENTS

CN    101393888 A    3/2009

OTHER PUBLICATIONS

You Yin et al.; "Multilevel Storage in Lateral Top-Heater Phase-Change Memory"; IEEE Electron Device Letters, vol. 29, No. 8, Aug. 2008.

(Continued)

*Primary Examiner* — Laura Menz
(74) *Attorney, Agent, or Firm* — Cantor Colburn LLP

(57) ABSTRACT

Defining an active region of a phase change memory (PCM) cell including depositing a first layer of material having a first chemical composition. A second layer of material having a second chemical composition is deposited on top of the first layer of material. An electrical current pulse is applied to locally heat a region of the first layer of material and the second layer of material to cause at least one of an inter-diffusion and a liquid mixing of the first layer of material and the second layer of material. This results in in the PCM cell containing a self-aligned region that includes a phase change material that is a mixture of the first chemical composition and the second chemical composition.

6 Claims, 14 Drawing Sheets

(56) References Cited

U.S. PATENT DOCUMENTS

| | | |
|---|---|---|
| 7,272,037 B2 | 9/2007 | Lee et al. |
| 7,351,992 B2 | 4/2008 | Scheuerlein |
| 7,411,818 B1 | 8/2008 | Elmegreen et al. |
| 7,473,921 B2 | 1/2009 | Lam et al. |
| 7,514,705 B2 | 4/2009 | Breitwisch et al. |
| 7,518,212 B2 | 4/2009 | Moore et al. |
| 7,608,848 B2 | 10/2009 | Ho et al. |
| 7,639,527 B2 | 12/2009 | Lee et al. |
| 7,701,750 B2 | 4/2010 | Shih et al. |
| 7,718,988 B2 | 5/2010 | Lee |
| 7,781,269 B2 | 8/2010 | Wang et al. |
| 7,881,089 B2 | 2/2011 | Franceschini et al. |
| 7,929,338 B2 | 4/2011 | Franceschini et al. |
| 7,977,674 B2 | 7/2011 | Yoon et al. |
| 7,989,796 B2 | 8/2011 | Lam et al. |
| 8,098,517 B2 | 1/2012 | Kostylev |
| 8,107,276 B2 | 1/2012 | Breitwisch et al. |
| 8,124,968 B2 | 2/2012 | Koo et al. |
| 8,144,508 B2 | 3/2012 | Franceschini et al. |
| 8,159,857 B2 | 4/2012 | Gammel et al. |
| 8,263,317 B2 | 9/2012 | Fargeix et al. |
| 8,324,605 B2 | 12/2012 | Lung et al. |
| 2004/0175804 A1 | 9/2004 | Skonezny et al. |
| 2007/0096090 A1 | 5/2007 | Dennison |
| 2007/0246748 A1 | 10/2007 | Breitwisch et al. |
| 2007/0246848 A1 | 10/2007 | Pavan et al. |
| 2007/0295948 A1 | 12/2007 | Lam et al. |
| 2008/0048213 A1 | 2/2008 | Liu |
| 2008/0048293 A1 | 2/2008 | Horii |
| 2008/0101109 A1 | 5/2008 | Haring-Bolivar et al. |
| 2008/0157051 A1 | 7/2008 | Lam et al. |
| 2008/0164452 A1 | 7/2008 | Joseph et al. |
| 2008/0186760 A1 | 8/2008 | Elmegreen et al. |
| 2008/0247224 A1 | 10/2008 | Lung |
| 2008/0285335 A1 | 11/2008 | Elmegreen et al. |
| 2009/0014770 A1 | 1/2009 | Terao et al. |
| 2009/0141546 A1 | 6/2009 | Kim et al. |
| 2009/0146128 A1 | 6/2009 | Lee et al. |
| 2009/0196091 A1 | 8/2009 | Kau et al. |
| 2010/0059477 A1 | 3/2010 | Fargeix et al. |
| 2010/0084624 A1 | 4/2010 | Lung et al. |
| 2010/0214811 A1 | 8/2010 | Franceschini et al. |
| 2010/0214829 A1 | 8/2010 | Franceschini |
| 2010/0214830 A1 | 8/2010 | Franceschini et al. |
| 2010/0259962 A1 | 10/2010 | Yan et al. |
| 2011/0096594 A1 | 4/2011 | Franceschini et al. |
| 2011/0134676 A1 | 6/2011 | Breitwisch et al. |
| 2011/0180775 A1* | 7/2011 | Lin et al. ............... 257/4 |
| 2011/0317481 A1 | 12/2011 | Franceschini et al. |
| 2012/0049144 A1 | 3/2012 | Franceschini et al. |

OTHER PUBLICATIONS

Daniele Ielmini et al.; "Recovery and Drift Dynamics of Resistance and Threshold Voltages in Phase-Change Memories"; IEEE Transactions on Electron Devices; vol. 54, No. 2; Feb. 2, 2007.

PCT International Search Report and Written Opinion for International Application No. PCT/EP2011/060595; Date of Mailing: Sep. 29, 2011.

P. Haring Bolivar et al.; "Lateral Design for Phase Change Random Access Memory Cells with Low-Current Consumption"; Institute of Semiconductor Electronics, RWTH Aachen University Sommerfeldstr. 24, 52056 Aachem, Germany 2003.

S. Raoux et al.; "Phase-change random access memory: a scalable technology"; IBM J. Res. Dev.; vol. 52, Jul. 4, 2008; pp. 465-479.

Ken 'ichiro Sonoda et al.; "A Compact Model of Phase Change Memory Based on Rate Equations of Crystallization and Amorphization"; IEEE Transactions on Electronic Devices; vol. 55, No. 7, Jul. 2008.

You Yin et al. "Programming Margin Enlargement by Material Engineering for Multilevel Storage in Phase-Change Memory"; Applied Physics Letters 95, 133503 (2009), 3 pages.

* cited by examiner

FIG. 4A  SOLID METAL BITLINE

FIG. 4B  TRENCH-PLATED BITLINE

POST-FABRICATION SELF-ALIGNED INITIALIZATION OF INTEGRATED DEVICES

CROSS-REFERENCE TO RELATED APPLICATION

This application is a divisional of U.S. patent application Ser. No. 12/873,058, filed Aug. 31, 2010, and all the benefits accruing therefrom under 35 U.S.C. §119, the contents of which in its entirety are herein incorporated by reference.

BACKGROUND

This present invention relates generally to computer memory, and more specifically to phase change memories (PCMs).

A PCM is a form of resistive non-volatile computer random-access memory (RAM) that stores data by altering the state of the matter from which the device is fabricated. Phase change materials can be manipulated into two or more different phases or states, with each phase representing a different data value. Generally, each phase exhibits different electrical properties (or different resistance values). The amorphous and crystalline (or polycrystalline) phases are typically two phases used for binary data storage (1's and 0's) since they have detectable differences in electrical resistance. Specifically, the amorphous phase has a higher resistance than the crystalline phase.

Chalcogenides are a group of materials commonly utilized as phase change material. This group of materials contains a chalcogen (Periodic Table Group 16/VIA) and another element. Selenium (Se) and tellurium (Te) are the two most common elements in the group used to produce a chalcogenide semiconductor when creating a PCM memory cell. Example chalcogenides include $Ge_2Sb_2Te_5$ (germanium-antimony-tellurium or "GST"), $SbTe_3$, and $In_2Se_3$.

Altering the phase change material's state can be achieved by heating the material to a melting point and then cooling the material to one of the possible states, or by heating an amorphous region to, or near, a crystallization temperature to convert some or all of the amorphous material to crystalline form. A current passed through the phase change material creates heat and causes the phase change material to melt. Melting and gradually cooling down the phase change material allows time for the phase change material to form the crystalline state. Melting and abruptly cooling the phase change material quenches the phase change material into the amorphous state. Heating to below the melting temperature can also be used to crystallize amorphous material without melting.

SUMMARY

An embodiment is a method of creating a localized region of material having a target chemical composition. The method includes defining an electrical circuit on a substrate, and depositing on the electrical circuit one or more layers of materials having one or more chemical compositions. An electrical current pulse is applied to the electrical circuit to create a self-aligned localized region having the target chemical composition. Applying the electrical current pulse causes a portion of the one or more layers of materials to be heated, resulting in the target chemical composition.

Another embodiment is a method of defining an active region of a phase change memory (PCM) cell. The method includes depositing a first layer of material having a first chemical composition, and depositing a second layer of material having a second chemical composition on top of the first layer of material. An electrical pulse is applied to locally heat a region of the first layer and the second layer to cause at least one of an inter-diffusion and a liquid mixing of the first layer of material and the second layer of material, resulting in a PCM cell that includes a self-aligned region made up of a phase change material that is a mixture of the first chemical composition and the second chemical composition.

Another embodiment is a PCM cell that includes a first electrode contacting a first layer of material having a first chemical composition, a second layer of material having a second chemical composition, and a second electrode contacting the first layer of material or the second layer of material. The PCM cell is configured for receiving at least one electrical current pulse flowing from the first electrode to the second electrode to locally heat a region of the first layer and the second layer to cause at least one of inter-diffusion and liquid mixing of the first layer of material and the second layer of material, resulting in a self-aligned region of phase change material having a chemical composition that is a mixture of the first chemical composition and the second chemical composition.

A further embodiment is a design structure tangibly embodied in a machine readable medium for designing, manufacturing, or testing an integrated circuit. The design structure has a substantially planar surface and includes a PCM cell. The PCM cell includes a first electrode contacting a first layer of material having a first chemical composition, a second layer of material having a second chemical composition, and a second electrode contacting the first layer of material or the second layer of material. The PCM cell is configured for receiving at least one electrical current pulse flowing from the first electrode to the second electrode to locally heat a region of the first layer and the second layer to cause at least one of inter-diffusion and liquid mixing of the first layer of material and the second layer of material, resulting in a self-aligned region of phase change material having a chemical composition that is a mixture of the first chemical composition and the second chemical composition.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 4A-4D depict parallel path memory cell structures in accordance with embodiments described herein;

DETAILED DESCRIPTION

Figure 1:
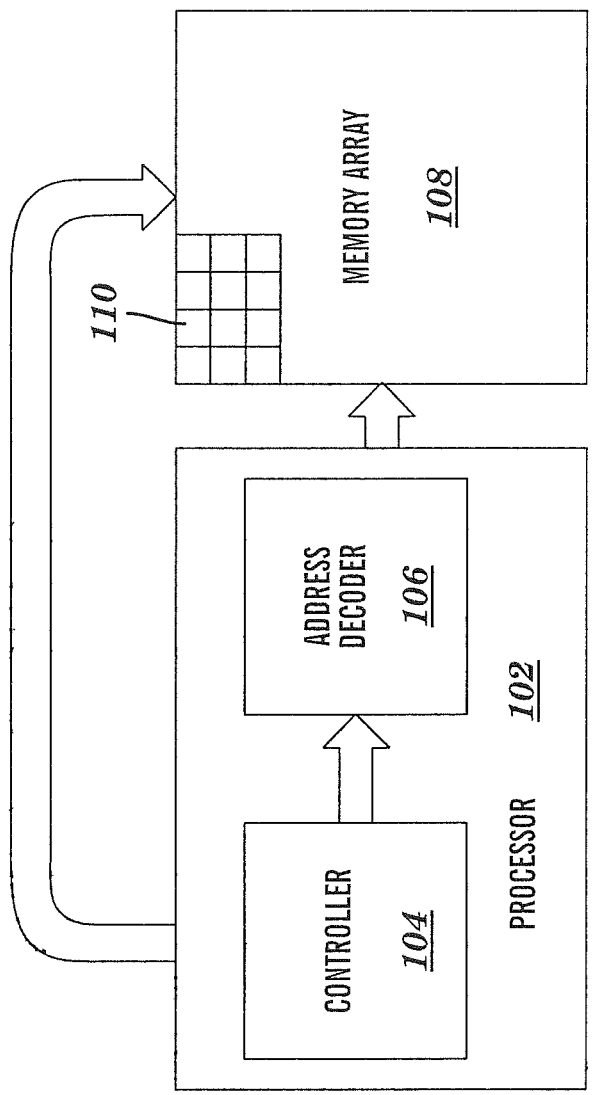
FIG. 1 illustrates a system programming a phase change memory (PCM) device in accordance with exemplary embodiments of the present invention.

A phase change memory (PCM) requires a relatively significant effective power density (e.g., $W/nm^3$ or "watts per molten cubic nanometer") to operate the PCM cell into a reset state. Operating the PCM cell into a reset state includes creating a substantial quantity of amorphous material so to significantly increase the cell resistance over the polycrystalline (or set) state resistance. This requires the use of relatively large access devices that are capable of driving the currents required for resetting the cells and sustaining the voltages required to induce threshold switching in the amorphous phase.

The large power requirement has lead to research in the area of the miniaturization of the PCM cell and its components (e.g., the electrodes). In particular, in vertical cell structures such as the mushroom cell or the uTrench cell, the bottom electrode is typically obtained using sub-lithographic methods, in order to reduce as much as possible the active region of the device (i.e., the spatial region in which the electrical conduction and the thermal phenomena happen).

An embodiment of the present invention provides for the definition of a self-aligned sub-lithographic active region. The definition of the active region is carried out after fabrication (or even after packaging) and relies on a chemical reaction that is triggered by extreme heating in the hottest region between two electrodes. Benefits to this approach are that the active portion (i.e., the phase changing portion) of the phase change material will be confined in a small region, thus allowing low power operation. Benefits also include the ability to reduce the mask count and the precision required in phase change material patterning (also allowing several cells to share the same patch of phase change material).

In accordance with embodiments described herein, two or more layers of material having different compositions are deposited, and then one or more electrical heating pulses are utilized to cause the diffusion and/or mixing of the two material layers. The result is a region of material having a composition that is a combination of the two layers. This approach is used to create a sub-lithographic PCM region in the high-field region (i.e., the region where current crowding is maximum) near two electrodes of a memory device. In one embodiment, the first layer over (or between) the two electrodes is what is often referred to as an ovonic threshold switch (OTS) amorphous material that breaks down and conducts electricity when the electric field (or temperature) exceeds some threshold. The second layer contains donor material (either different elements or different ratios of the same elements) that, when mixed with the OTS layer, creates a PCM material that can exist in both a high resistance amorphous state and low resistance quasi-crystalline state.

As used herein the term "conducting material" refers to any material that conducts electricity (implemented, for example by an electrode). The conductive material may be composed of, but is not limited to one or more of: titanium, tungsten, titanium nitride, and titanium aluminum nitride. Optionally, a non-metallic conductive material can be used, such as, but not limited to polysilicon or other semiconductor or doped semiconductor material.

As used herein the term "insulator" or "insulator material" refers to any material that resists the flow of electric current. Examples of insulator materials include, but are not limited to: silicon dioxide, aluminum oxide, silicon nitride, and titanium oxide. Insulators may also be referred to as dielectrics.

As used herein, the term "phase change material" refers to any material that can be manipulated into two or more different phases or states, such as, but not limited to the chalcogenides described above. For discussion purposes, GST is used below as an example of a phase change material. This is not intended to limit embodiments to GST as other embodiments may utilize other phase change materials.

As used herein, the term "phase change material (crystalline)" refers to phase change material that is in a crystalline or polycrystalline phase.

As used herein, the term "phase change material (amorphous)" refers to phase change material that is in an amorphous phase. The amorphous phase has a higher resistance value than the crystalline phase.

As used herein, the term "threshold switching material" refers to any material that in normal conditions has minimal conductivity and that breaks down and conducts electricity when the electric field (or temperature) exceeds some threshold. The OTS amorphous material described above is an example of a threshold switching material. In an embodiment, the amorphous threshold switching material exhibits high electrical resistivity at low electric field strength and substantially reduced electrical resistivity at electric field strengths above a threshold.

As used herein, the term "complementary material" refers to any donor material (either different elements or different ratios of the same elements as the threshold switching material) that, when mixed with the threshold switching material, creates a PCM material that can exist in both a high resistance amorphous state and low resistance quasi-crystalline state.

As used herein, the term "self-aligned" refers to a geometric region the position of which is defined by the shape and position of some previously defined regions. For example, the temperature isocurve for a specific temperature in a PCM cell driven with a given electrical signal is "self aligned" to the so-called active region of the PCM cell, i.e., the region that comprises most of the current flow and where transformation between amorphous and polycrystalline material happens.

As used herein, the term "diffusion" refers to molecules of a first material entering the bulk of an adjacent second material, usually with a speed that increases with the temperature of the two materials As used herein, the term "liquid mixing" refers to the formation of a third material by liquid phase mixing of two starting materials In one embodiment, where a target chemical composition is that of a phase change material (such as GST), the threshold alloy, or threshold switching material, is $Ge_xSb_yTe_z$; and the complementary alloy, or complementary material, is $Ge_{1-x}Sb_{2-y}Te_{4-z}$. In this embodiment, for every mole of the threshold alloy that is deposited, two moles of the complementary alloy are deposited. The layers of the threshold alloy and the complementary alloy can be arranged in different individual thicknesses and number of layers, and only the total stoichiometric quantity has to be respected.

Reduction of the programming power is important in PCM technology because it has an impact on the design of the circuitry required to program the memory cell. In an exemplary embodiment, the circuitry required to program the memory cell includes: (i) an access device (e.g., a diode or a transistor); (ii) a bit line to support the programming current; (iii) peripheral circuitry that drives the bit line; and (iv) charge pumps whenever present.

FIG. 1 illustrates a system for programming a PCM in accordance with embodiments. The system depicted in FIG. 1 includes a processor 102, and a memory array 108. The processor 102 depicted in FIG. 1 includes a controller 104 and an address decoder 106. As depicted in FIG. 1, the memory array 108 includes a plurality of memory cells 110. In an embodiment, a memory cell 110 is configured to store binary data represented by at least two resistance states or configurations of phase change material (referred to as a "single level cell" or "SLC"). One of the resistance states is a high resistance state. In another embodiment, the memory cell 110 is configured to store more than two values represented by three or more resistance state ranges or configurations of phase change material (referred to as a "multiple level cell" or "MLC").

In an embodiment, the controller 104 identifies and selects memory cells 110 in the memory array 108 for programming. The address decoder 106 then decodes memory addresses from the controller 104 and applies a range of word line biases to the memory cells 110 in the memory array 108.

Figure 2:
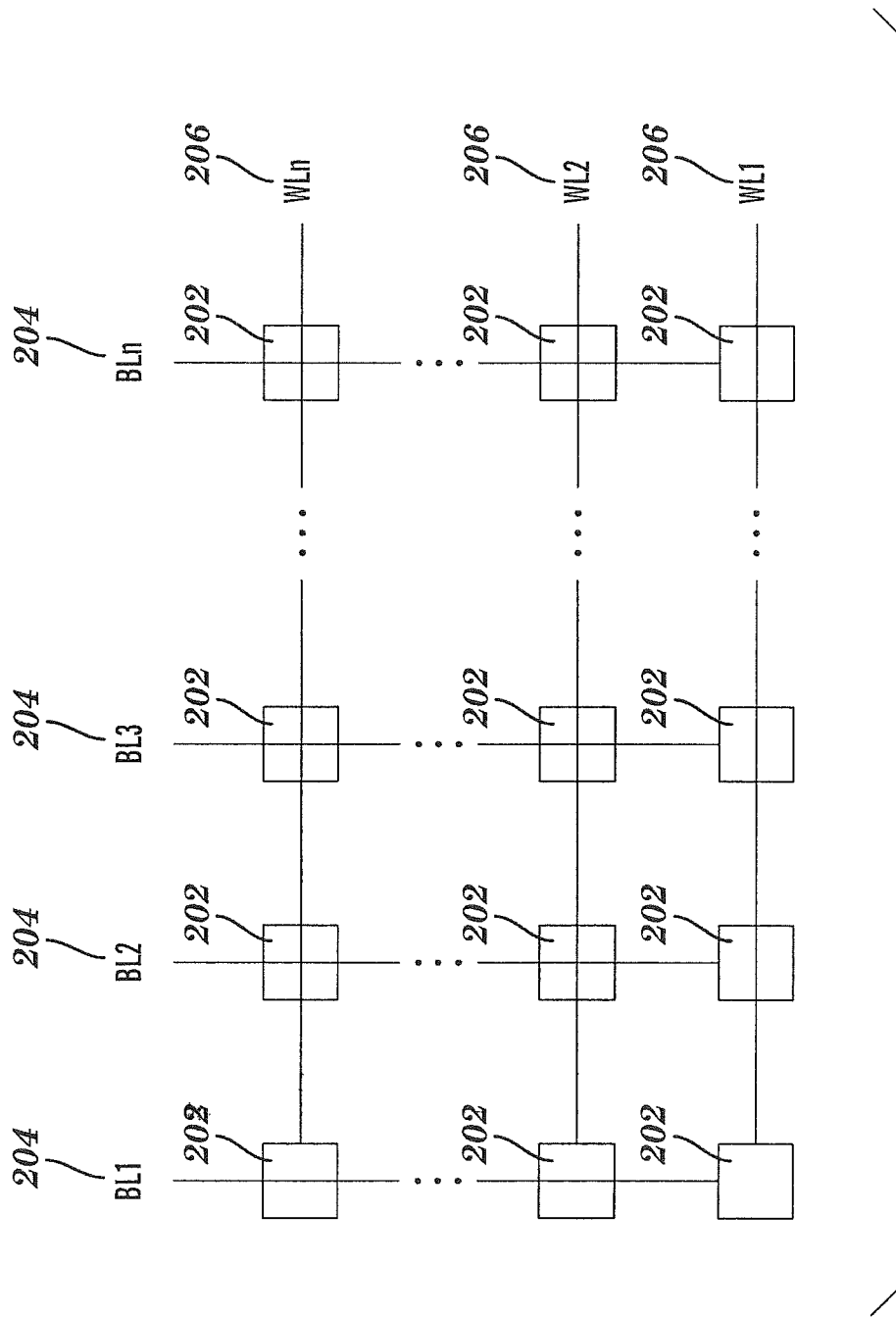
FIG. 2 depicts an example structure of a memory array in accordance with exemplary embodiments.

FIG. 2 depicts an example structure of a memory array in accordance with an embodiment. As shown in FIG. 2, the memory array includes a plurality of memory cells 202 electrically coupled to bit lines 204 and word lines 206. In an embodiment, each memory cell 202 is comprised of a memory element access device and a resistive memory element for storing a resistance value. In an embodiment, the resistive memory element is a PCM element that includes phase change material and two electrodes. In an embodiment, the data in a memory cell 202 connected to a bit line 204 is accessed (read or programmed) by turning off the access devices of other memory cells 202 connected to the bit line 204. The access devices of the other memory cells 202 are turned on and off using the word lines 206.

Figure 3A:
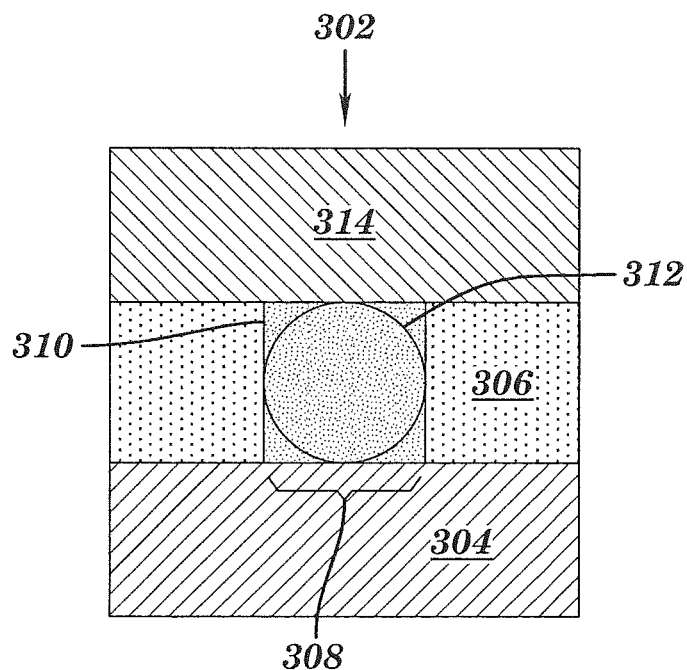
FIGS. 3A-3B depict vertical path memory cell structures in accordance with embodiments described herein.
Figure 3B:
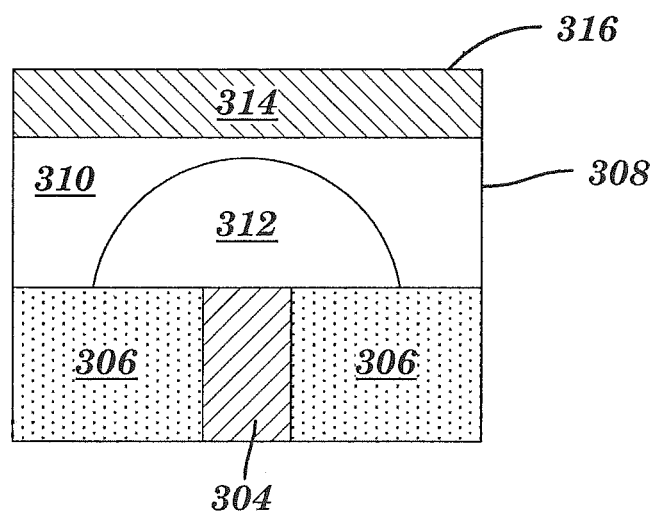

FIGS. 3A-3B depict vertical path memory cell structures in accordance with embodiments described herein. FIG. 3A depicts a series-path memory cell 302, also known as "pore cell" that includes a bottom electrode 304, a dielectric layer 306, phase change material 308, and a top electrode 314. The phase change material 308 shown may be comprised of crystalline or polycrystalline phase change material 310 and a volume of amorphous phase change material 312. For many moderate to high cell resistance levels, the amorphous phase change material 312 almost completely occludes the cross-section of the phase-change material, forcing a significant fraction of the current to flow through the amorphous phase change material 312 and crystalline phase change material 310 regions in series. FIG. 3B depicts a side view of a memory cell 316, also known as "mushroom" cell, where the bottom electrode 304 is sub-lithographic and the phase change material (e.g., GST) patterning is not sub-lithographic.

Figure 4C:
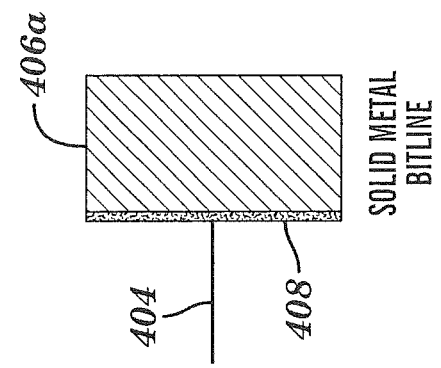
Figure 4C:
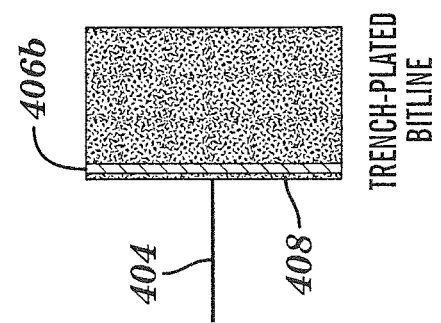
Figure 4C:
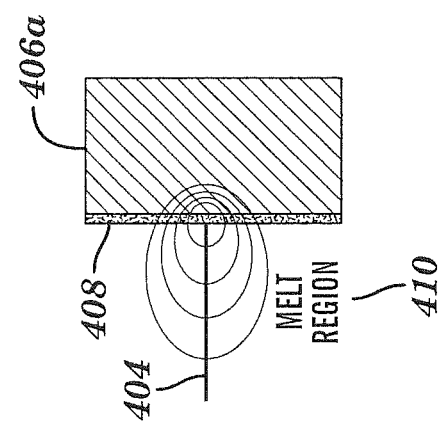

FIGS. 4A-4D depict parallel path memory cell structures in accordance with embodiments described herein. U.S. patent application Ser. No. 12/823,924 filed Jun. 25, 2010 describes parallel path memory cell structures and is hereby incorporated by reference in its entirety. FIGS. 4A-4D depict a top view, looking down through a storage material layer. The exemplary structures in FIGS. 4A and 4B are characterized by one sub-lithographic strip electrode (the first conductive electrode region 404) (e.g., a plated trench wall having a plating thickness of about five nanometers) orthogonal to another electrode (the second conductive electrode region 406) (e.g., a plated trench wall or a solid metal line) with a sub-lithographic inter-electrode gap defined by a thickness of a deposited insulator film or layer (the insulator layer 408) (e.g., having a thickness of about three to twenty nanometers, or up to the feature size for the adopted lithography). Both FIGS. 4A and 4B depict an in-plane dual-electrode structure (i.e., both electrodes are on the bottom of the GST layer and the top surface of the GST is insulated). In an embodiment, both electrodes and the GST thickness are sub-lithographic and the GST patterning is not sub-lithographic.

Turning now to FIG. 4C, in an exemplary embodiment, at least a portion of the first conductive electrode region 404 and the second conductive electrode region 406 are covered with a layer of storage material. In an exemplary embodiment, the exemplary cell structure provides a small melt region 410 that grows asymmetrically, obscuring a variable percentage of at least the first conductive electrode region 404 as the current increases.

Figure 4D:
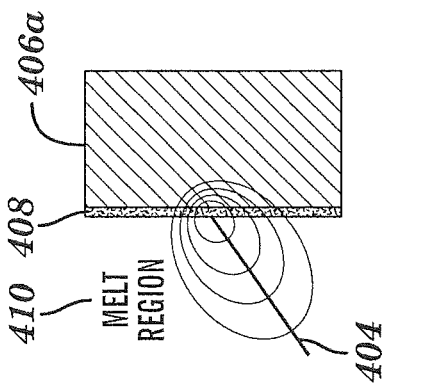

Turning now to the embodiment in FIG. 4D, the first conductive electrode region 404 and the second conductive electrode region 406a are not orthogonal to one another. In this embodiment, the current distribution and the melt region will no longer be symmetric with respect to the axis of the first conductive electrode region 404. In fact, this embodiment has no planes of symmetry.

Figure 5:
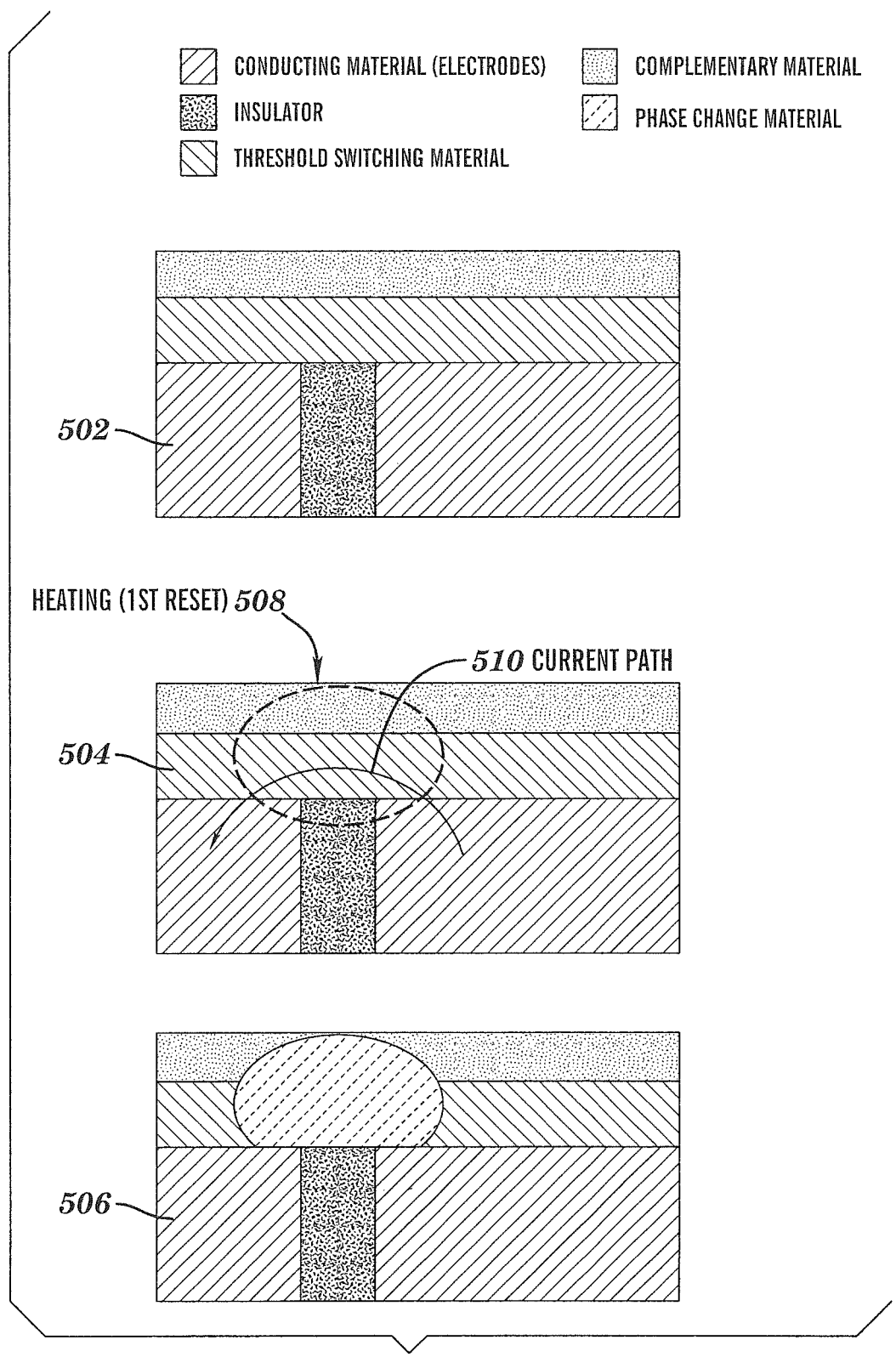
FIG. 5 depicts several side views of an embodiment of a self-aligned parallel cell with a threshold switching layer.

FIG. 5 depicts several side views of an embodiment of a self-aligned parallel cell with a threshold switching layer. Parallel cell 502 includes two electrodes separated by an insulator, and topped with a threshold switching material located under a complementary material. In an embodiment, the threshold switching material exhibits high resistance which results in a reduced cell-to-cell electrical interference and the ability for more than one cell to share the same GST patch. Parallel cell 504 depicts a current path 510 (or current flow passing through, in this example, the threshold switching material) when a reset pulse is applied to the conducting material (e.g., an electrode) on the right side of the parallel cell 504. As shown in the parallel cell 504, the threshold switching material and complementary material are heated thus melting a region 508 when the first reset pulse is applied. Parallel cell 506 depicts the result of the heating of the threshold switching material and the complementary material by the first reset pulse. As shown in parallel cell 506, the first reset pulse mixes the two layers (threshold switching material and complementary material) creating a self-aligned region of phase change material having a target chemical composition. In an embodiment, the target chemical composition approximates GST (a phase change material) in a crystalline state. In an embodiment the crystalline state in region 508 is obtained by slowly reducing trailing current in the first reset pulse.

Figure 6:
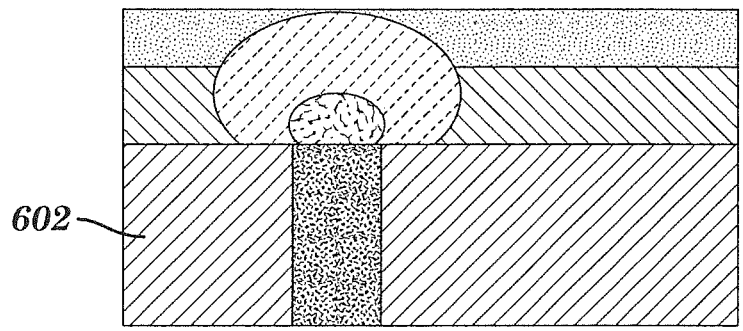
FIG. 6 depicts a parallel cell after a small reset pulse has been applied to create an amorphous region inside a crystalline region.

FIG. 6 depicts a parallel cell 602 after a small reset pulse has been applied to create an amorphous region inside the crystalline region depicted in parallel cell 506.

The creation of the GST in a crystalline state is an initialization process that is generally performed after manufacturing (or after fabrication) and before the cell is used to store data. In addition, the initialization process may be performed periodically during the lifetime of the memory device.

Figure 7:
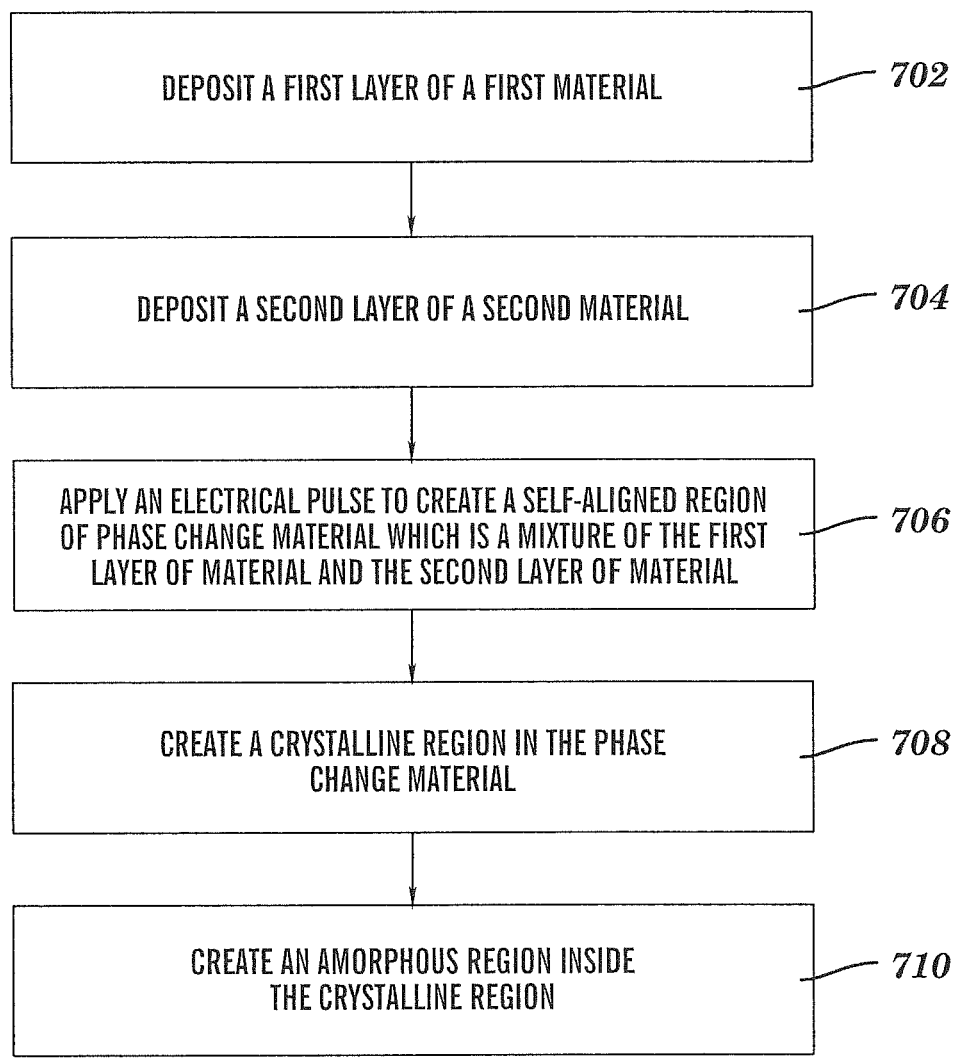
FIG. 7 depicts a process flow for creating and initializing a phase change memory in accordance with an embodiment.

FIG. 7 depicts a flow of a process for creating and initializing a self-aligned PCM cell in accordance with an embodiment. At block 702, a first layer of a first material is deposited (e.g., a threshold switching material). At block 704, a second layer of a second material is deposited (e.g., a complementary material). At block 706, a self-aligned region of phase change material is created. In an embodiment, the self-aligned active region is created as described above in FIG. 5 by applying a reset pulse that mixes a threshold switching material and a complementary material. Other manners of creating the self-aligned active region are described below. In an embodiment, the phase change material that is created is a crystalline phase change material region and block 708 is skipped. In another embodiment, at block 708, a crystalline phase change material region is created in the phase change material by applying a relatively large set electrical pulse, via the electrodes, to the phase change material. After the crystalline phase change material region is created, the cell is now initialized and ready for use in storing data. At block 710, data is stored in the memory cell by creating a second, smaller amorphous material region inside the active crystalline material region using a reset pulse that is smaller than the set pulse applied in block 710.

Blocks 704-710 of the process described in FIG. 7 may be performed by the manufacturer after fabrication, by a customer prior to using the memory device and/or periodically as part of a maintenance procedure.

In an embodiment, the size of the active crystalline region is controlled (e.g., via the set pulse) to create a desired minimum cell resistance, which is the result of the parallel combination of an outer path through any crystalline material outside of the amorphous region plus an inner path through the active crystalline region. Controlling (e.g., being able to adjust or adjusting) the size of the active crystalline region provides precise control of the minimum cell resistance and enables data storage through the creation of a fixed or variable-sized amorphous region inside of the active crystalline region. In an embodiment, the volume of the amorphous phase change material is increased by applying an electrical pulse having an amplitude larger than a previously applied electrical pulse and/or a duration shorter than a previously applied electrical pulse, the applying via one or both of the electrodes. In an embodiment, the volume of the amorphous phase change material is decreased by applying an electrical pulse having an amplitude lower than a previously applied electrical pulse and/or a duration longer than a previously applied electrical pulse.

In embodiments, normal operation of the cell includes the steps of creating an amorphous or a crystalline region by melting a region and then rapidly quenching (to create amorphous material) or reducing the current so that the region crystallizes while cooling (to create crystalline material). Another typical operation is to convert some or all of an amorphous region without melting, by heating enough, and for long enough time, for crystallization to occur. In embodiments, the memory cell is programmed to a specific resistance value by applying an electrical signal large enough to cause the melting of a region that will create an amount of amorphous material sufficient for creating the desired resistance value. The peak value of the electrical signal can be estimated using finite element analysis of the cell. Alternatively, the cell can be programmed with a pulse that melts a sufficiently large region, slowly decreases to the above described peak value and is abruptly removed to quench the molten phase-change material. In embodiments, the modes of operation of the cell are preceded by an initialization process that confines the crystalline region into a sub-lithographic area.

A process similar to the process depicted in FIG. 7 may be utilized to create a localized region of material on a substrate, where the localized region of material has a target chemical composition. In this process, an electrical circuit is defined on the substrate, and one or more layers of materials having one or more chemical compositions are deposited on the electrical circuit. An electrical current pulse is then applied to the electrical circuit to create a self-aligned localized region that approximates the target chemical composition. Applying the electrical current pulse causes at least a portion of the deposited layers to be heated, and the heating causes the creation of the localized region of material with the target chemical composition. An electrical circuit can be defined or created on a substrate by means of lithographic or photo-lithographic techniques. As used herein, the term "substrate" refers to any structure on which another structure is then built. A substrate may be an insulating substrate such as, but not limited to silica or alumina. In another embodiment the substrate is a semiconductor substrate such as a monocrystal substrate of materials including, but not limited to, silicon, gallium-arsenide or germanium. Other options for a substrate include a wafer that has been previously processed with planar lithographic techniques. In an embodiment, the electrical circuit is implemented by a network of conductive material or by a standard integrated circuit using, in addition to lithographically defined connections, integrated semiconductor devices such as transistors and diodes. Those skilled in the art will recognize that embodiments of the present invention are not limited by the quality or the purpose of the substrate and that the specific definition of a circuit defined on a substrate does not limit the applicability of embodiments of the present invention.

Figure 8:
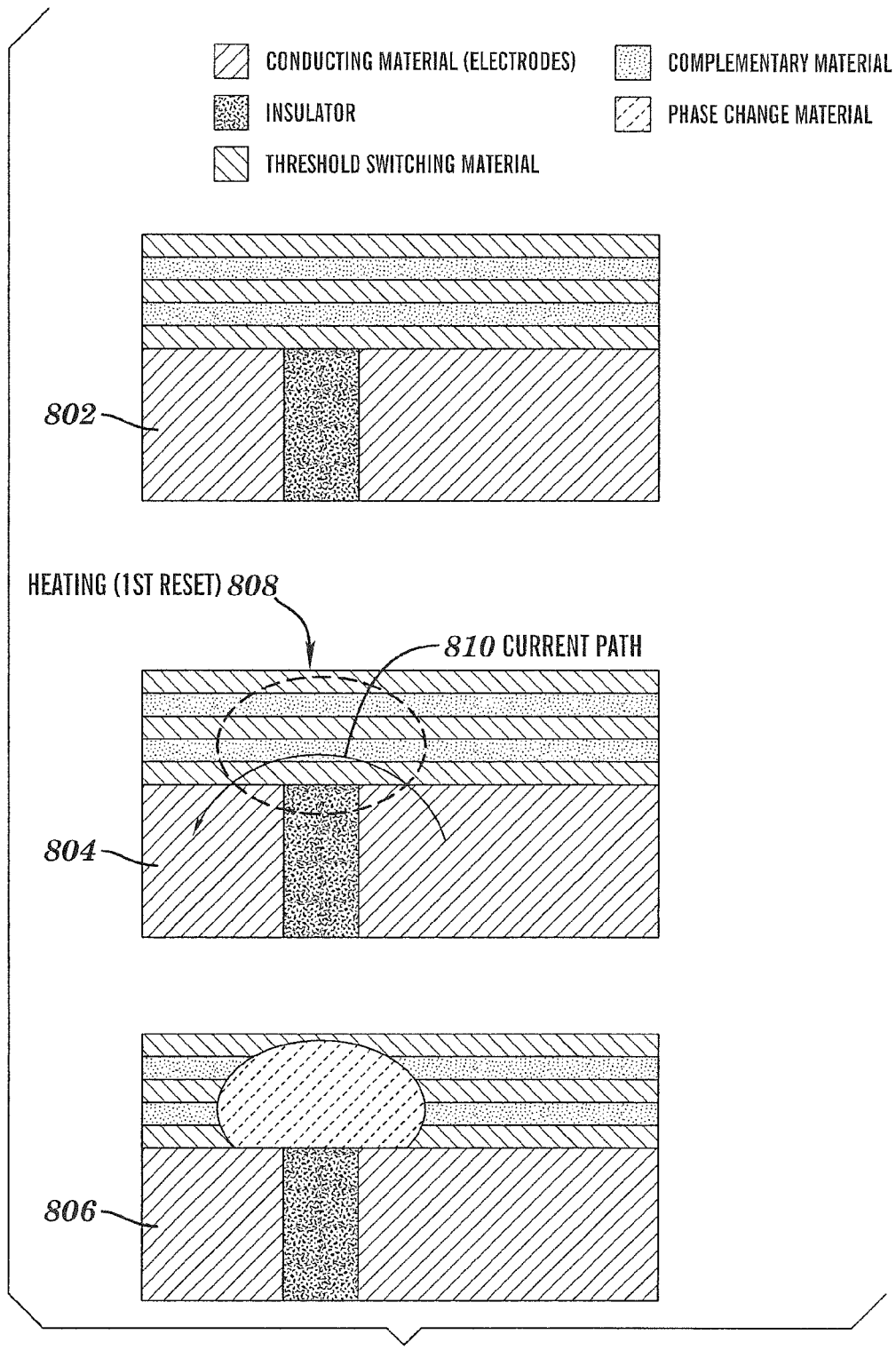
FIG. 8 depicts several side views of an embodiment of a self-aligned parallel cell with several intermixed threshold switching layers and complementary layers.

FIG. 8 depicts several side views of an embodiment of a self-aligned parallel cell with several intermixed threshold switching layers and complementary layers. Parallel cell 802 includes two electrodes separated by an insulator, and topped with several intermixed layers of threshold switching material and complementary material. Using several intermixed layers of threshold switching material and complementary material can aid in mixing the two types of material together to form the phase change material. FIG. 8 depicts a current path 810 (or current flow) when a reset pulse is applied to the conducting material (e.g., an electrode) on the right side of the parallel cell 804. As shown in the parallel cell 804, the threshold switching material and complementary material are heated creating a molten region when the first reset pulse is applied. Parallel cell 806 depicts the result of the heating of the threshold switching material and the complementary material by the first reset pulse. As shown in parallel cell 806, the first reset pulse mixes the two layers (threshold switching material and complementary material) creating a self-aligned region of phase change material.

Figure 9:
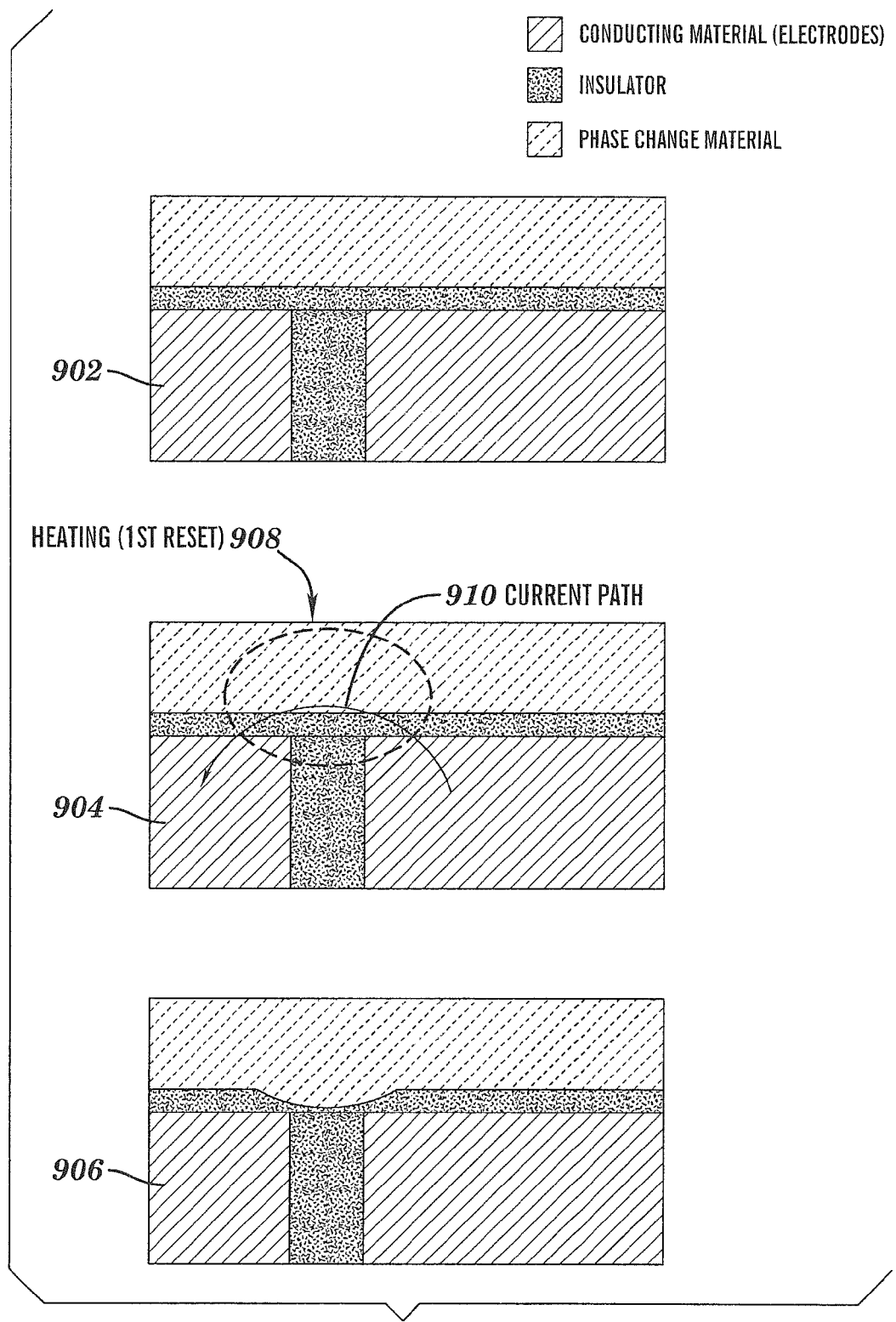
FIG. 9 depicts several side views of an embodiment of a self-aligned parallel cell with a phase change material layer and an insulator layer.

FIG. 9 depicts several side views of an embodiment of a self-aligned parallel cell with a phase change material layer and an insulator layer. Parallel cell 902 includes two electrodes separated by an insulator, and topped with a thin insulator layer located under a phase change material. Parallel cell 902 depicts a current path 910 (or current flow) when a reset pulse is applied to the conducting material (e.g., an electrode)

on the right side of the parallel cell 904. As shown in the parallel cell 904, the insulator and phase change material are heated creating a molten region 908 when the first reset pulse is applied. Parallel cell 906 depicts the result of the heating of the insulator and the phase change material by the first reset pulse. As shown in parallel cell 906, the first reset pulse locally degrades the insulator layer and the phase change material (e.g., the GST) directly contacts the electrodes creating a self-aligned active region.

Figure 10:
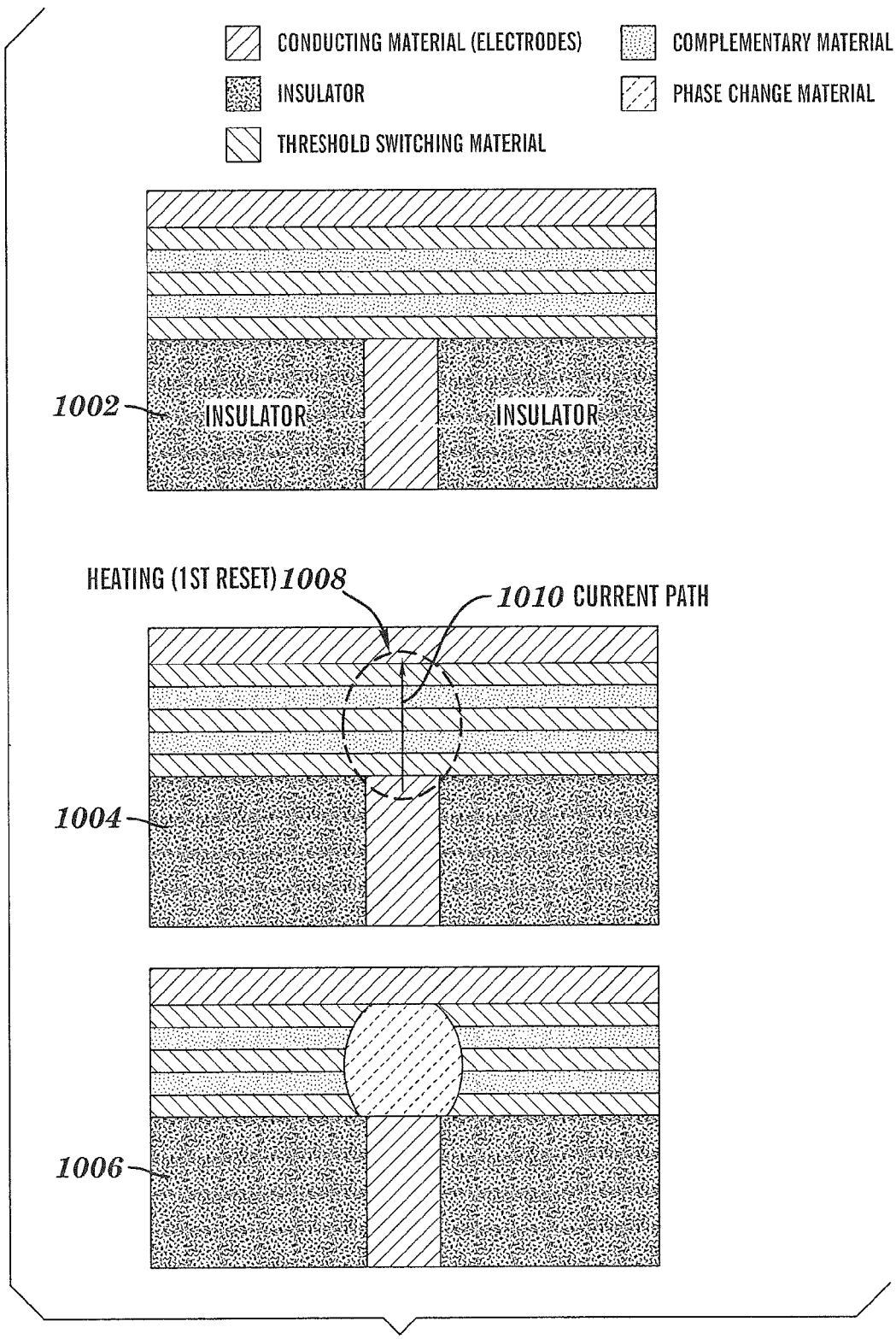
FIG. 10 depicts several side views of an embodiment of a self-aligned mushroom cell with multiple threshold switching material layers and complementary material layers.

FIG. 10 depicts several side views of an embodiment of a self-aligned mushroom cell with multiple threshold switching material layers and complementary material layers. Mushroom cell 1002 includes two electrodes separated by the layers of threshold switching material and complementary material. Mushroom cell 1004 depicts a current path 1010 (or current flow) when a reset pulse is applied to the conducting material (e.g., an electrode) on the bottom of the mushroom cell 1004. As shown in the mushroom cell 1004, the threshold switching material and complementary material are heated creating a molten region 1008 when the first reset pulse is applied. Mushroom cell 1006 depicts the result of the heating of the threshold switching material and the complementary material by the first reset pulse. As shown in mushroom cell 1006, the first reset pulse mixes the layers (threshold switching material and complementary material) creating a self-aligned region of phase change material. In an embodiment, the phase change material is GST in a polycrystalline state.

Figure 11:
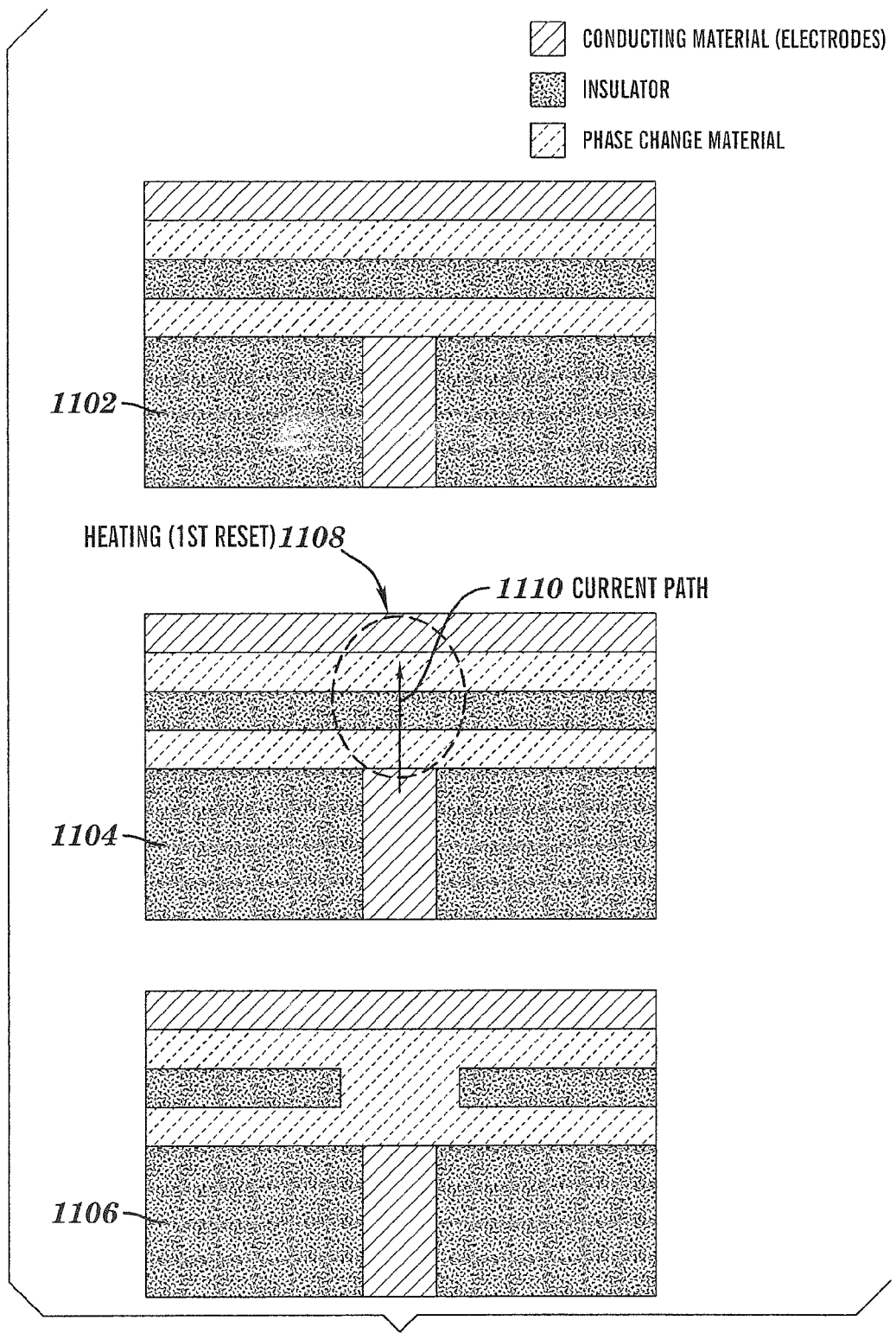
FIG. 11 depicts several side views of an embodiment of a self-aligned mushroom cell with two layer of phase changing material enclosing a thin layer of sacrificial insulator material.

FIG. 11 depicts several side views of an embodiment of a self-aligned mushroom cell with multiple threshold switching material layers and complementary material layers. Mushroom cell 1102 includes two electrodes separated by the layers of an insulating material and a phase change material. Mushroom cell 1104 depicts a current path 1110 (or current flow) when a reset pulse is applied to the conducting material (e.g., an electrode) on the bottom of the mushroom cell 1104. As shown in the mushroom cell 1104, the insulator and phase change material are heated 1108 when the first reset pulse is applied. Mushroom cell 1106 depicts the result of the heating of the insulator and the phase change material by the first reset pulse. As shown in mushroom cell 1106, the first reset pulse breaks a hole through the insulator creating a self-aligned region of phase change material. The final structure can be seen as a self-aligned pore cell.

Figure 12:
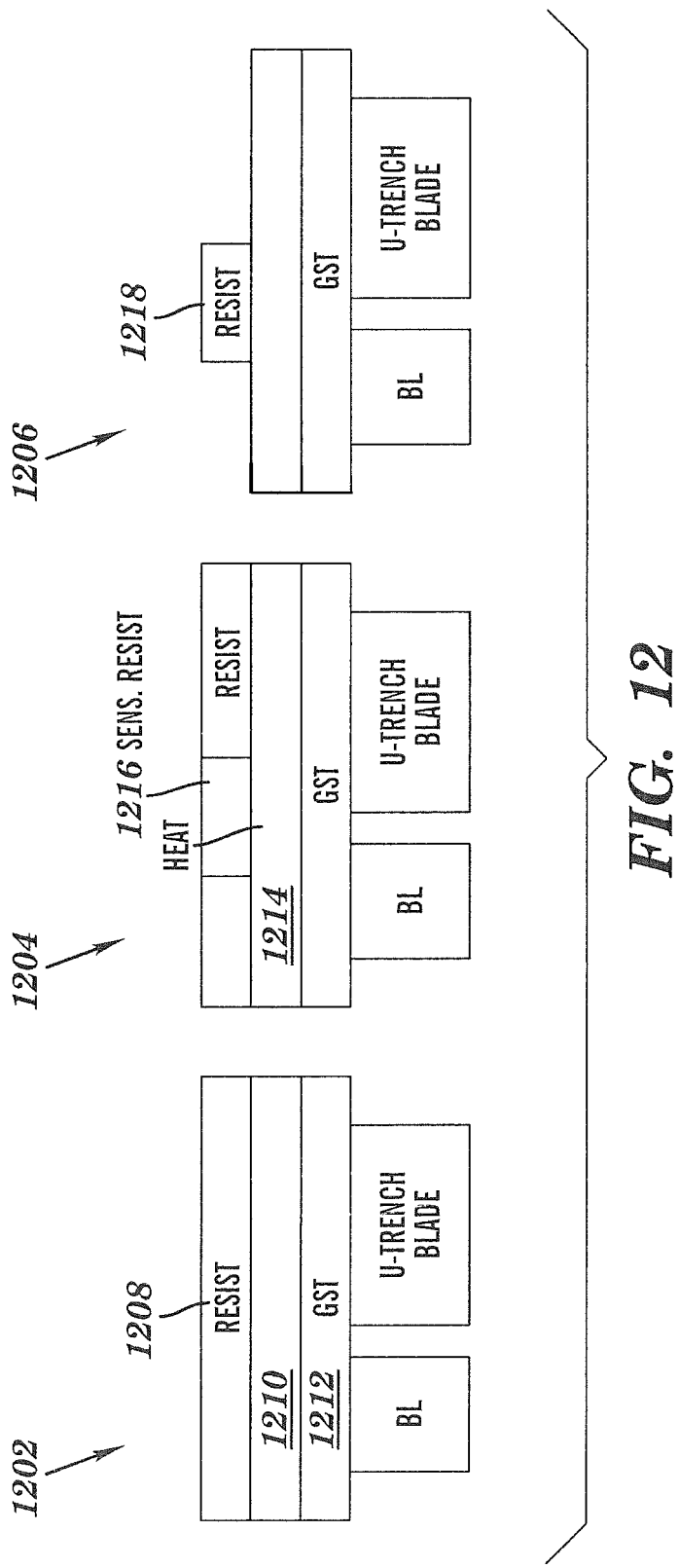
FIG. 12 depicts several side views of an embodiment where a resist layer has been deposited on a parallel path PCM cell.

FIG. 12 depicts several side views of an embodiment where a resist layer has been deposited on a parallel path PCM cell. On a parallel path PCM cell 1202, deposition of a GST layer 1212 has been followed by the deposition of a thin insulating layer 1210. On top of the insulating layer 1210, a topmost layer of resist 1208 has been deposited. By applying power to the PCM cell 1202 at fabrication time, PCM cell 1204 is obtained, where the active area 1214 is heated and a portion 1216 of the resist 1208 is sensitized. A subsequent process step is used to obtain the sensitized resist as shown in PCM cell 1206. In this embodiment, the target chemical composition is that of the sensitized resist 1218. As shown in PCM cell 1206 a self-aligned patterning of sensitized resist 1218 is created which covers the active area of the phase change material. In an embodiment, a subsequent step includes etching the insulating layer 1210 and the GST layer 1212 not covered by the sensitized resist 1218. In an embodiment, the insulator layer 1212 is omitted or substituted with other materials providing heat transfer and electrical properties, as well as chemical properties compatible with the process, the materials used in the lower layers and the requirements on the shape of the sensitized region. Positive or negative resist can be used leading to different shapes of the developed area. In an embodiment, an extent of the localized region is responsive to the geometry of the electrical circuit where the PCM cell 1206 is located and to one or more of a magnitude (or strength) and a duration of the electrical current pulse used to heat the portion 126 of the resist 1208. In an embodiment, the self-aligned localized region defines a region for sensitizing the chemical resist, the sensitizing occurring in response to the increase of temperature.

Figure 13:
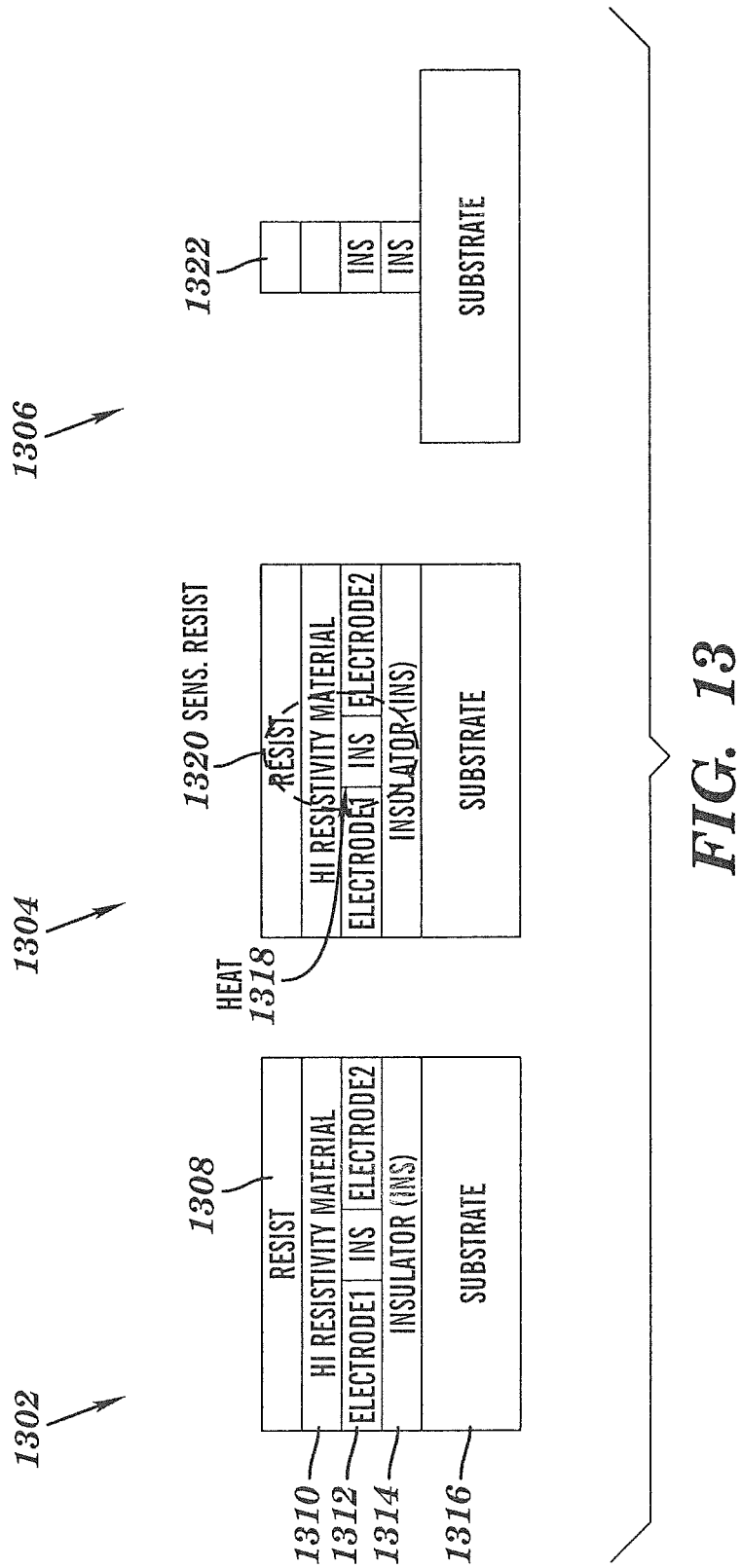
FIG. 13 depicts several side views of an embodiment where a heat generating structure is sacrificial and removed by etching.

FIG. 13 depicts several side views of an embodiment where a heat generating structure is sacrificial and removed by etching. The sacrificial heat generating structure 1302 shown in FIG. 13 includes an insulator layer 1314, and sacrificial electrodes 1312 built on a substrate 1316. As shown in FIG. 13, a high resistivity material layer 1310 is deposited followed by the deposition of a resist 1308 in the topmost layer. By applying power to the structure 1302, structure 1304 is obtained, where the active area 1318 defined by the electrodes 1312 is heated 1318 and a portion 1320 of the resist 1308 in the topmost layer is sensitized. A subsequent process step resulting in structure 1306 develops the sensitized resist 1322, and performs etching of the portion of the layers not covered by the developed resist, including the circuit used to generate heat, thus creating a self aligned pattern defined by the shape of the sacrificial circuit. In an embodiment, the circuit is only partially removed. In exemplary embodiments positive or negative resist can be used.

Technical effects and benefits include the ability to confine the active portion of phase change material to a very small region of a memory device, thus allowing ultra low power operation. Embodiments as described herein allow the mask count to be reduced, allow a reduction in the precision required in phase change memory patterning, and allow several cells to share the same phase change memory patch.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 14:
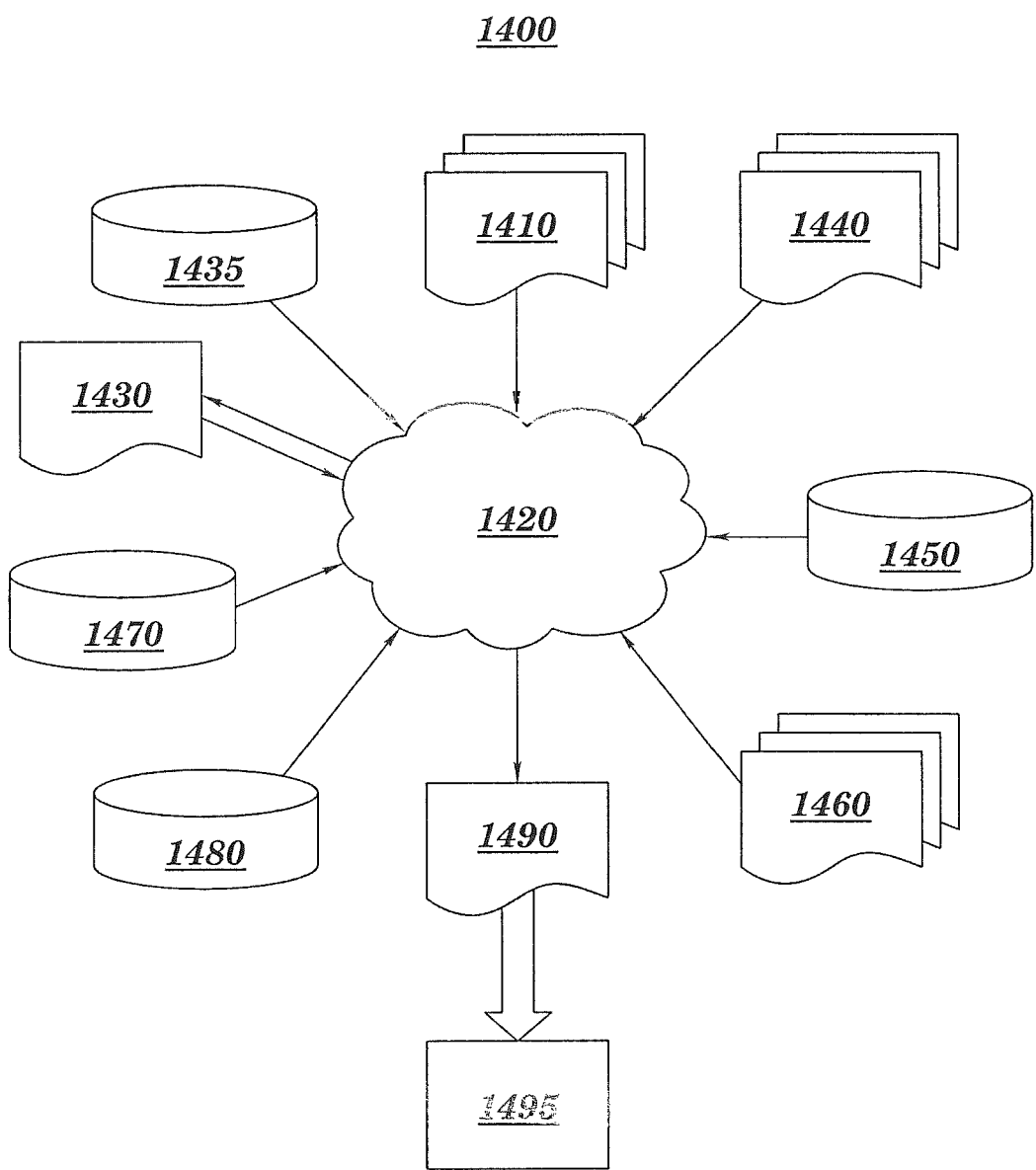
FIG. 14 is a flow diagram of a design process used in semiconductor design, manufacture, and/or test.

FIG. 14 shows a block diagram of an exemplary design flow 1400 used for example, in semiconductor IC logic design, simulation, test, layout, and manufacture. Design flow 1400 includes processes, machines and/or mechanisms for processing design structures or devices to generate logically or otherwise functionally equivalent representations of the design structures and/or devices described above and shown in FIGS. 1-2, 3A-3B, 4A-4D, 5-6, and 8-13.

The design structures processed and/or generated by design flow 1400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1400 may vary depending on the type of representation being designed. For example, a design flow 1400 for building an application specific IC (ASIC) may differ from a design flow 1400 for designing a standard component or from a design flow 1400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1420 that is preferably processed by a design process 1410. Design structure 1420 may be a logical simulation design structure generated and processed by design process 1410 to produce a logically equivalent functional representation of a hardware device. Design structure 1420 may also or alternatively comprise data and/or program instructions that when processed by design process 1410, generate a functional representation of the physical structure of a hardware device. Whether representing functional and/or structural design features, design structure 1420 may be generated using electronic computer-aided design (ECAD) such as implemented by a core developer/designer. When encoded on a machine-readable data transmission, gate array, or storage medium, design structure 1420 may be accessed and processed by one or more hardware and/or software modules within design process 1410 to simulate or otherwise functionally represent an electronic component, circuit, electronic or logic module, apparatus, device, or system such as those shown in FIGS. 1-2, 3A-3B, 4A-4D, 5-6, and 8-13. As such, design structure 1420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1410 preferably employs and incorporates hardware and/or software modules for synthesizing, translating, or otherwise processing a design/simulation functional equivalent of the components, circuits, devices, or logic structures shown in FIGS. 1-2, 3A-3B, 4A-4D, 5-6, and 8-13 to generate a netlist 1480 which may contain design structures such as design structure 1420. Netlist 1480 may comprise, for example, compiled or otherwise processed data structures representing a list of wires, discrete components, logic gates, control circuits, I/O devices, models, etc. that describes the connections to other elements and circuits in an integrated circuit design. Netlist 1480 may be synthesized using an iterative process in which netlist 1480 is resynthesized one or more times depending on design specifications and parameters for the device. As with other design structure types described herein, netlist 1480 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1410 may include hardware and software modules for processing a variety of input data structure types including netlist 1480. Such data structure types may reside, for example, within library elements 1430 and include a set of commonly used elements, circuits, and devices, including models, layouts, and symbolic representations, for a given manufacturing technology (e.g., different technology nodes, 32 nm, 45 nm, 100 nm, etc.). The data structure types may further include design specifications 1440, characterization data 1450, verification data 1460, design rules 1470, and test data files 1485 which may include input test patterns, output test results, and other testing information. Design process 1410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1410 without deviating from the scope and spirit of the invention. Design process 1410 may also include modules for performing standard circuit design processes such as timing analysis, verification, design rule checking, place and route operations, etc.

Design process 1410 employs and incorporates logic and physical design tools such as HDL compilers and simulation model build tools to process design structure 1420 together with some or all of the depicted supporting data structures along with any additional mechanical design or data (if applicable), to generate a second design structure 1490. Design structure 1490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1420, design structure 1490 preferably comprises one or more files, data structures, or other computer-encoded data or instructions that reside on transmission or data storage media and that when processed by an ECAD system generate a logically or otherwise functionally equivalent for one or more of the embodiments of the invention shown in FIGS. 1-2, 3A-3B, 4A-4D, 5-6, and 8-13. In one embodiment, design structure 1490 may comprise a compiled, executable HDL simulation model that functionally simulates the devices shown in FIGS. 1-2, 3A-3B, 4A-4D, 5-6, and 8-13.

Design structure 1490 may also employ a data format used for the exchange of layout data of integrated circuits and/or symbolic data format (e.g. information stored in a GDSII (GDS2), GL1, OASIS, map files, or any other suitable format for storing such design data structures). Design structure 1490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2, 3A-3B, 4A-4D, 5-6, and 8-13. Design structure 1490 may then proceed to a stage 1495 where, for example, design structure 1490: proceeds to tape-out, is released to manufacturing, is released to a mask house, is sent to another design house, is sent back to the customer, etc.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method of defining an active region of a phase change memory (PCM) cell comprising:
    depositing a first layer of material having a first chemical composition, the depositing on top of a first conductive electrode region that forms a bit line and on top of a second conductive electrode region that includes a u-trench;
    depositing a second layer of material having a second chemical composition on top of the first layer of material;
    depositing a resist layer on top of the second layer of material; and
    applying an electrical current pulse to locally heat a region of the first layer of material and the second layer of material to cause at least one of an inter-diffusion and a liquid mixing of the first layer of material and the second layer of material, resulting in the PCM cell comprising a self-aligned region comprising a phase change material that is a mixture of the first chemical composition and the second chemical composition and a portion of the resist layer being sensitized;
    wherein the portion of the resist layer that is sensitized covers the self-aligned region of the PCM cell.

2. The method of claim 1, wherein the applying the electrical current pulse causes an electrical current to flow from the first conductive electrode region to the second conductive electrode region, the electrical current passing through at least the first layer of material.

3. The method of claim 1, wherein the first layer of material is an amorphous threshold switching material having high electrical resistivity at low electric field strength and substantially reduced electrical resistivity at electric field strengths above a threshold.

4. The method of claim 1, wherein the first layer of material is an insulator and the second layer of material is the phase change material, or the first layer of material is the phase change material and the second layer of material is an insulator.

5. The method of claim 1, wherein the PCM cell is characterized by a parallel path memory cell structure.

6. The method of claim 1, wherein the PCM cell is characterized by a vertical path memory cell structure.

* * * * *